United States Patent
Siegel et al.

(10) Patent No.: US 7,284,186 B2
(45) Date of Patent: *Oct. 16, 2007

(54) PARITY CHECK OUTER CODE AND RUNLENGTH CONSTRAINED OUTER CODE USABLE WITH PARITY BITS

(75) Inventors: Paul H. Siegel, La Jolla, CA (US); Mats Öberg, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 456 days.

This patent is subject to a terminal disclaimer.

(21) Appl. No.: 10/862,847

(22) Filed: Jun. 7, 2004

(65) Prior Publication Data

US 2004/0225950 A1    Nov. 11, 2004

Related U.S. Application Data

(63) Continuation of application No. 09/577,552, filed on May 24, 2000, now Pat. No. 6,795,947.

(60) Provisional application No. 60/158,211, filed on Oct. 7, 1999.

(51) Int. Cl.
　　*G06F 11/00*　　(2006.01)
　　*H03M 13/00*　　(2006.01)
(52) U.S. Cl. ........................ 714/802; 714/803
(58) Field of Classification Search ........ 714/800–803, 714/702, 758
See application file for complete search history.

(56) References Cited

U.S. PATENT DOCUMENTS 3,786,439 A    1/1974  McDonald et al.
3,800,281 A    3/1974  Devore et al.
4,389,681 A    6/1983  Tanaka et al.
4,488,302 A    12/1984 Ahamed
6,018,304 A    1/2000  Bessios
6,052,072 A    4/2000  Tsang et al.
6,052,248 A    4/2000  Reed et al.

(Continued)

OTHER PUBLICATIONS

W.E. Ryan, "Optimal Code Rates for Concatenated Codes on a PR4-Equalized Magnetic Recording Channel", presentation dated Apr. 12, 1999.

(Continued)

*Primary Examiner*—Guy J. Lamarre
(74) *Attorney, Agent, or Firm*—Greer, Burns & Crain, Ltd.

(57) ABSTRACT

A method uses an outer code that is a concatenation of code words generated by a parity check encoder. The outer code word is permuted by an interleaver. The high rate coding provides good performance with a simple structure. A parity check bit is generated for each data word of received systematic dates. Code words are formed by adding a generated parity bit to each data word. Groups of code words are permuted to form encoded input for transmission in a communication channel. The invention further includes encoding to maintain a runlength-limiting (RLL) constraint at the channel input. Interleaved runlength encoded system data is used to generate error code bits. Insertion of error code bits in the system data at the channel input is controlled. This guarantees that the channel input stream comprised of the runlength-limited system data and inserted error code bits meets the runlength constraints.

19 Claims, 7 Drawing Sheets

U.S. PATENT DOCUMENTS

| | | |
|---|---|---|
| 6,229,458 B1 | 5/2001 | Altekar et al. |
| 6,241,778 B1 | 6/2001 | de Lind van Wijngaarden et al. |
| 6,243,847 B1 | 6/2001 | McClellan et al. |
| 6,282,690 B1 | 8/2001 | McClellan et al. |
| 6,456,208 B1 | 9/2002 | Nazari et al. |
| 6,795,947 B1 * | 9/2004 | Siegel et al. ................ 714/802 |

OTHER PUBLICATIONS

M. Öberg, P. Siegel, "Interleaver Modifications for Block Coding over a Delay Constrained Correlated Fading Channel".

W.E. Ryan, "Performance of High Rate Turbo Codes on a PR4-Equalized Magnetic Recording Channel", from Proceedings of IEEE Int'l Conference on Communications in Atlanta, GA (Jun. 1998).

W.E. Ryan, L.L. McPheters, S.W. McLaughlin, "Combined Turbo Coding and Turbo Equalization for PR-4 Equalized Lorentzian Channels", from Proceedings of the conference on Information Sciences and Systems (Mar. 1998).

C. Heegard, "Turbo Coding for Magnetic Recording", from Proceedings for Winter 1998 IEEE Information Theory Workshop in San Diego, CA, pp. 18-19, (Feb. 1998).

W. Pusch, H. Weinrichter, M. Taferner, "Turbo-Codes Matched to the $1-D^2$ Partial Response Channel", from proceedings of IEEE Intn'l Symposium on Information Theory in Cambridge, MA (Aug. 1998), p. 62.

T. Souvignier, A. Friedman, M. Öberg, P.H. Siegel, R.E. Swanson, J.K. Wolf, "Turbo Decoding for PR4: Parallel Versus Serial Concatenation", In *Proc. IEEE Int. Conf. Commun.*, (Vancouver, BC, Canada) IEEE, Jun. 1999.

M. Öberg and P.H. Siegel, "Application of Distance Spectrum Analysis to Turbo Code Performance Improvement", presented in part at the International Synmposium on Turbo Codes & Related Topics, Brest, France, Sep. 3-5, 1997, pp. 701-710.

T. Conway, "A New Target Response with Parity Coding for High Density Magnetic Recording Channels," *IEEE Transactions on Magnetics*, vol. 34, No. 4, Jul. 1998, pp. 2382-2386.

S. Benedetto, G. Montorsi, D. Divsalar, F. Pollara, "Soft-Input Soft-Output Modules for the Construction and Distributed Iterative Decoding of Code Network", *European Trans. Telecommunications*, vol. 9, No. 2, pp. 155-172, Mar./Apr. 1998.

L.R. Bahl, J. Cocke, F. Jelinek, J. Raviv, "Optimal Decoding of Linear Codes for Minimizing Symbol Error Rate", *IEEE Trans. Inform. Theory*, vol. 20, pp. 284-287, Mar. 1974.

C. Berrou and A. Glavieux, "Near Optimum Error Correcting Coding and Decoding: Turbo Codes", *IEEE Transactions on Communications*, vol. 44, No. 10, Oct. 1996, pp. 1261-1271.

T. Johansson and K. Zigangirov, "A Simple One-Sweep Algorithm for Optimal APP Symbol Decoding of Linear Block Codes", *IEEE Transactions on Information Theory*, vol. 44, pp. 3124-3128, Nov. 1998.

R.G. Gallager, "Low-Density Parity-Check Codes", *IRE Transactions on Information Theory*, vol. 8, pp. 21-28, Jan. 1962.

D. Divsalar, F. Pollara, "Turbo Codes for PCS Applications", IEEE, Jun. 1995, pp. 54-59.

J. Hagenauer, E. Offer, L. Papke, "Iterative Decoding of Binary Block and Convolutional Codes", IEEE Transaction on Information Theory, vol. 42, pp. 429-445, Mar. 1996.

Mats Öberg and Paul H. Siegel, *Performance Analysis of Turbo-Equalized Dicode Partial-Response Channel*, 36 Annual Allerton Conf. On Communication, Control and Computing, Monticello, IL, Sep. 1998, pp. 230-239.

* cited by examiner

PARITY CHECK OUTER CODE AND RUNLENGTH CONSTRAINED OUTER CODE USABLE WITH PARITY BITS

REFERENCE TO RELATED APPLICATION

This application claims priority under 35 U.S.C. §120 and is a continuation of application Ser. No. 09/577,552, filed May 24, 2000, now U.S. Pat. No. 6,795,947, issued Jan. 5, 2005, which claimed priority under 35 U.S.C. §119(e) from copending provisional application No. 60/158,211, filed on Oct. 7, 1999.

FIELD OF THE INVENTION

The invention generally concerns coded communication channels.

BACKGROUND OF THE INVENTION

Data is generally information of interest produced by an entity or a device. The source of data may be a device or a component within a device, such as a magnetic or optical storage device. In many practical applications, the data is communicated over a communication channel. The communication channel might be a wired or wireless connection to another device or to a component within the device which is the source of data for the communication channel. Communication channels add noise to data, which may corrupt the data and make portions of the data unrecognizable. Channel coding schemes seek to compensate for such problems by providing for verification of data and some ability to correct corrupted data. Many forms of channel coding have been developed and used.

A particularly powerful form of channel coding is known as turbo coding. The turbo encoder is a combination of two encoders which are individually weak, but are combined to produce a powerful coding scheme in a simple fashion. The input to a turbo encoder is a set of system data bits. Two encoders generate parity symbols from a simple code, typically a recursive convolutional code. One encoder creates the parity code directly from the system data bits. The other encoder produces the parity symbols from a permuted version of the system data bits obtained from an interleaver. Each of the separate encoders has a small number of states. The system data bits are sent over the communication channel with the separate parity symbols produced by the encoders. The permutation conducted by the interleaver ensures that in all but a small number of cases, when one encoder produces a low weight code word the other encoder will produce a high weight code word. Thus, the combination of the constituent codes is powerful.

At the decode side of a channel, there are two decoders. Each decoder trades estimates of the information bits and uses the estimate of the other and the data received from the channel to produce additional estimates using a decoding algorithm. Once satisfactory convergence is reached between the two decoders, the decoded channel output is available from the estimate of either of the decoders.

Partial response channels are typically used in magnetic data devices, such as disk drives. Partial Response Maximum Likelihood (PRML) is a technique to decode data in the presence of inter-symbol interference (ISI). ISI results from the overlap of analog signal peaks now streaming through disk drive read/write heads at higher and higher rates. PRML technology first converts the heads' analog signal to a digital signal, then uses the digital signal to detect data bits. Partial response is an equalization or filtering technique that controls intersymbol interference at multiples of a specified sampling interval. Maximum likelihood detection refers to the conversion of the partial response signal to data from additional decoding applied to the samples of the filtered signal. Viterbi detection implements a maximum likelihood detection algorithm that determines the data sequence for which the corresponding sampled partial response signal provides the best match of least error with the actual (noisy) samples of the channel output signal. The pattern that has the least error (difference) is the one with the maximum likelihood to be correct.

Various works have applied parallel concatenated turbo codes with iterative decoding to partial response channels of interest in digital recording. See, W. E. Ryan, *Performance of High Rate Turbo Codes on a PR4 Equalized Magnetic Recording Channel*, from Proceedings of IEEE Int'l Conference on Communications in Atlanta, Ga. (June 1998); W. E. Ryan et al., *Combined turbo Coding and Turbo Equalization for PR-4 Equalized Lorentzian Channels*, from Proceedings of the conference on Information Sciences and Systems (March 1998); C. Heegard, *Turbo coding for Magnetic Recording*, from Proceedings for Winter 1998 IEEE Information Theory Workshop in San Diego, Calif., pp. 18-19, (February 1998); W. Pusch et al., *Turbo-Codes Matched to the 1-$D^2$ Partial Response Channel*, from proceedings of IEEE Intn'l Symposium on Information Theory in Cambridge. Mass. (August 1998). Others have investigated the performance of a serial concatenation of a high rate convolutional code, interleaver, and partial response channel, with iterative decoding. See. Souvignier et al., *Turbo Codes for PR4: Parallel Versus Serial Concatenation*, from Proceedings of IEEE Intn'l Conference on Communications in Vancouver. BC, Canada. June 1999; Öberg and Siegel, *Performance Analysis of turbo Equalized Dicode Partial-Response Channel*, in Proceedings of the $35^{th}$ Annual Allerton Conference on Communications, Control, and Comp. in Monticello, Ill., pp. 230-39 (September 1998). The simple scheme performed as well as more complex turbo coding systems down to a bit error rate (BER) of about $10^{-5}$. Nonetheless, the convolutional coding itself is an impediment to further complexity reduction.

In addition. PRML and other data encoding schemes present problems to channel coding techniques. Data encoding schemes often have constraints which define conditions that the sequence of data may not violate. As a practical matter, PRML requires runlength constraints. Runlength constraints limit the number of consecutive bits that may be identical. Turbo coding schemes, which use an interleaver, make it difficult to have constraints in the channel because the interleaving of parity and data in pseudo-random fashion eliminates the possibility of imposing a constraint on the channel data stream.

In T. Conway, "A New Target Response with Parity Coding for High Density Magnetic Recording Channels," *IEEE Transactions on Magnetics*, Vol. 34, No. 4, July 1998, pp. 2382-2386, it is shows that, at densities of 3 and 3.5 bits per PW50, a parity-check code will detect a single occurrence of either of the two dominant error events on a Lorentzian channel equalized to the partial-responses target $h(D)=(1-D^2)(2+2D+D^2)$. An even-length code with odd parity is used to provide runlength constraints. Addition of a parity bit to a high-rate runlength constrained code is also proposed as a way to further reduce maximum runlengths of identical binary digits. The decoder consists of a Viterbi detector matched to the partial-response target followed by a post-processor. The post-processor uses the outputs of the Viterbi detector to generate estimates of the noise, then correlates the noise estimates with the two dominant error events, at each bit time. When a parity violation is detected in a code word, the type and location of the most likely error event within the code word or straddling its boundaries is determined from the largest noise correlation value. This method incorporating a parity-check code, channel Viterbi detector, and postprocessor is shown to achieve performance comparable to that of previous higher-order PRML systems that incorporate distance-enhancing constrained codes. However, for future data storage systems, there remains the need for a coding and decoding method that provides even greater performance gains, while maintaining high rate, code runlength constraints, and reduced-complexity decoding.

Thus, improvements and variations have been made to the general turbo coding scheme since its introduction, seeking to enhance performance and reduce complexity. There nonetheless remains a need for an improved channel coding method with reduced implementation complexity that can achieve coding gains comparable or in excess to prior turbo coding techniques. It is an object of the invention to provide such an improved method. There further remains a need to provide an improved channel coding scheme which can ensure the meeting of runlength constraints in the channel. It is a further object of the invention to provide such an improved coding scheme.

SUMMARY OF THE INVENTION

These and other objects and needs are met by the invention. A method of the invention uses an outer code that is a concatenation of code words generated by a parity check encoder. The outer code word is then permuted by an interleaver. The high rate coding provides good performance with a simple structure. According to the method, a parity check bit is generated for each data word of received systematic dates. Code words are formed by adding a generated parity bit to each data word. Groups of code words are permuted to form encoded input for transmission in a communication channel.

The invention further includes encoding to maintain a runlength-limiting (RLL) constraint at the channel input. Interleaved runlength encoded system data is used to generate error code bits, which may be parity bits. Insertion of error code bits in the system data at the channel input is controlled to limit the number of error code bits inserted per a defined grouping of system bits. The limit guarantees that the channel input stream comprised of the runlength-limited system data and the inserted error code bits meets the runlength constraints. Optionally, the error code bits can be interleaved prior to insertion, but this adds complexity without significantly improving performance.

BRIEF DESCRIPTION OF THE DRAWINGS

Other features, objects and advantages of the invention will be apparent by reference to the detailed description and the drawings, of which.

DETAILED DESCRIPTION OF THE PREFERRED EMBODIMENTS

The detailed description presents the general methods of the invention, and also presents some typical performance evaluations based upon common channels and channel conditions. These evaluation results are intended to illustrate beneficial performance of the invention under commonly considered benchmarks. The performance evaluations and exemplary channels do not limit application of the invention to the exemplary channels and performance targets.

Figure 1:
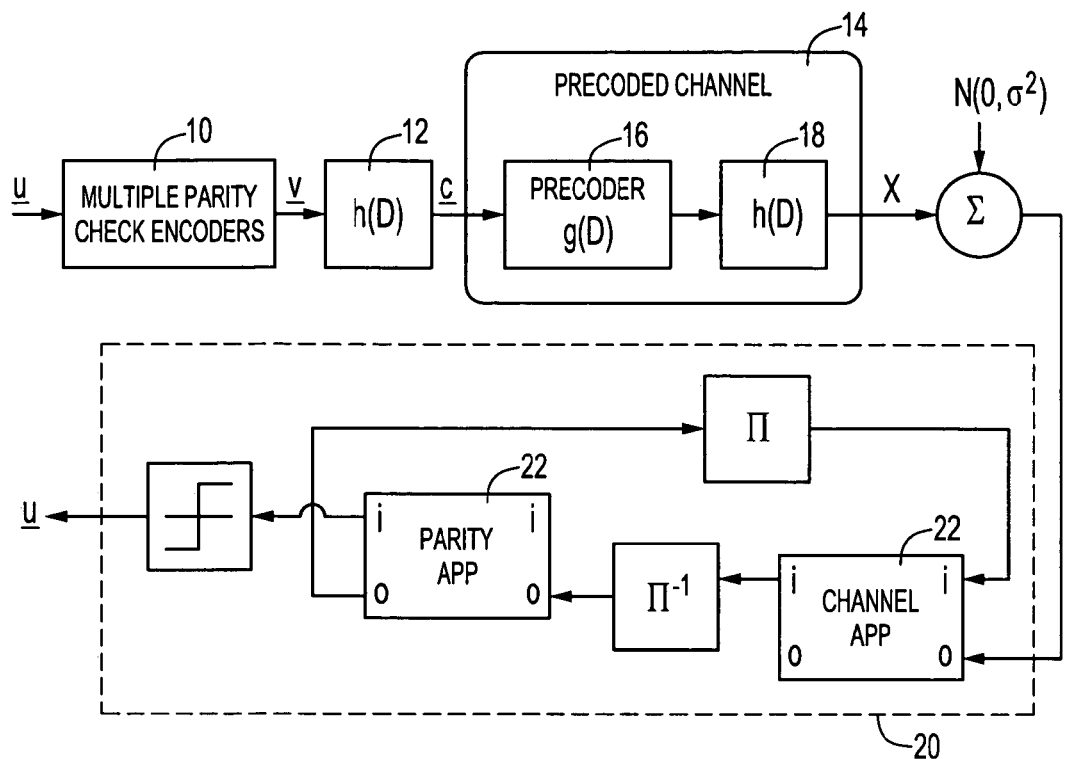
FIG. 1 is a block diagram illustrating a system constructed according to the method of the invention.

A preferred method of the invention is illustrated with respect to the system shown in FIG. 1. According to the invention, system bits u, formed into data words, are accepted by parity encoders 10. The use of multiple encoders 10 assumes parallel generation of parity bits for separate code words, but a single encoder might accomplish the same in serial fashion. The encoders 10 generate an odd parity bit for each data word to form code words. A group of code words is then permuted by an interleaver 12. This forms a simple but effective outer parity coding scheme for input to a channel 14. The channel and coding are discussed in more detail as follows.

A. Encoder 10

The parity-check encoder 10 accepts N data words $u_i=(u_{i,1}, u_{i,2} \ldots u_{i,n-1})=1, \ldots, N$ of n−1 system information bits each. The encoder output consists of N code words $c_i=(c_{i,1}, c_{i,2} \ldots c_{i,n})$, i=1, . . . , N of n bits each, defined as follows:

$$c_{i,j} = \begin{cases} u_{i,j} & 1 \leq j < n \\ \sum_{k=1}^{n-1} u_{i,k} + 1 \bmod 2 & j = n. \end{cases} \quad (1)$$

Thus, a bit is appended to each data word to ensure odd parity.

B. Interleaver 12

The interleaver 12 performs a permutation of the Nn output bits from the encoder 10. The type of permutation is a matter of design choice, but three types of specific interleavers have been considered and will be discussed. A first type is the pseudo-random interleaver, which is just a randomly generated permutation of the encoder output. The S-random interleaver is random as well, but mappings of bits that are closer than S in distance at the input cannot be closer than S at the output. The third type of interleaver is not a true permuter, but rather a probabalistic device. It is the average over all possible interleavers and will be referred to as a uniform interleaver. This type of interleaver is more amenable to theoretical analysis of code performance.

C. Precoded Partial Response Channel 14

A linear channel with additive white Gaussian noise (AWGN) is assumed for performance simulation evaluations of the present invention. Several particular commonly used partial response targets are considered. Similar performance results are expected for other partial response targets. The first considered target is the dicode channel 18 $h(D)=(1-D)$, which is also the simplest model and therefore used in the analysis. For this target the precoder 16 is $g(D)=1/(1\ominus D)$, where $\oplus$ denotes modulo-2 addition. The precoded dicode channel can be interleaved to model the precoded class-4 (PR4) partial response channel.

The other targets considered are "extended PR4" (EPR4) and $E^2PR4$ with transfer polynomials $h(D)=1+D-D^2-D^3$ and $h(D)=1+2D-2D^3-D^4$, respectively. For those targets, several precoders have been considered, all of the form $1/(1\oplus D^{p1}\ominus \ldots \ominus D^{pk})$.

The transmission power is normalized so that the energy per code symbol $E_s=1$. The signal to noise ratio (SNR) is defined as $SNR=10 \log E_b/N_0$, where we set $E_b=E_s/R-1/R$. The one-sided power spectral density $N_0=2\sigma^2$. Since the rate $R=(n-1)/n$, we have $E_b=n/(n-1)$ and the noise variance is $\sigma^2=n/(2(n-1)10^{SNR/10})$. The noise is added at the output of the partial response channel.

D. Decoder 20

Turbo decoding of a channel encoded by the method of the invention is performed by two soft-in soft-out (SISO) decoders 22 that pass information between each other via an interleaver/deinterleaver. The SISO's are matched to the precoded channel 16 and the parity check encoder, respectively. Each SISO is an a posteriori probability (APP) detector, which computes the a posteriori probability of the corresponding encoder input and/or output symbol, using a priori information. A description of a general APP algorithm is included in any of: S. Benedetto, G. Montorsi, D. Divsalar, F. Pollara, "Soft-Input Soft-Output Modules for the Construction and Distributed Iterative Decoding of Code Network", *European Trans. Telecommunications*, Vol. 9, pp. 155-172, March/April 1998; L. R. Bahl, J. Cocke, F. Jelinek, J. Raviv, "Optimal Decoding of Linear Codes for Minimizing Symbol Error Rate", *IEEE Trans. Inform. Theory*, Vol. 20, p. 284-287, March 1974; C. Berrou and A. Glavieux. "Near Optimum Error-Correcting Coding and Decoding: Turbo Codes", *IEEE Trans. Commons.*, Vol. 44. pp. 1261-1271, October 1996; and J. Hagenauer, E. Offer, L. Papke. "Iterative Decoding of Binary Block and Convolutional Codes", *IEEE Trans. Inform. Theory*, Vol. 42, pp. 429-445, March 1996.

Figure 2:
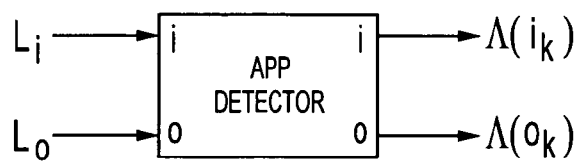
FIG. 2 illustrates an a posteriori probability (APP) detector for the decoder of FIG. 1.

FIG. 2 depicts a general APP detector block. The symbols corresponding to the encoder input and output are denoted as i and o, respectively. The inputs $L_i$ and $L_o$ denote a priori information for encoder input and output symbols. The $\Lambda(i_k)$ and $\Lambda(o_k)$ denote a posteriori probabilities corresponding to encoder inputs and outputs, respectively. For a symbol u, drawn from some finite alphabet of size l, $A=\{a_1, a_2, \ldots, a_l\}$, the general a priori and a posteriori probabilities are used to form log-APP ratios as follows:

$$L(u=a_j) = \log\frac{Pr(u=a_j)}{Pr(u \neq a_j)} \quad (2)$$

$$\Lambda(u=a_j) = \log\frac{Pr(u=a_j|L_i,L_o)}{Pr(u \neq a_j|L_i,L_o)} \quad (3)$$

where $L_i$ is a vector containing all a priori information regarding encoder inputs, and $L_o$ is a vector containing all a priori information regarding encoder outputs.

In the case of the binary alphabet $A=\{0, 1\}$, we use the shorthand notations $$L(u) \stackrel{def}{=} L(u=1) \text{ and } \Lambda(u) \stackrel{def}{=} \Lambda(u=1).$$

Note that then $L(u=0)=-L(u)$ and $\Lambda(u=0)=-\Lambda(u)$.

The channel APP is matched to the precoded partial response channel. The number of detector trellis states for the dicode, PR4, EPR4, and $E^2PR4$, are 2, 4, 8, and 16, respectively. The number of detector trellis states affects the complexity of the decoder. We define the inputs and output of the channel APP as follows. The decoder has two different inputs, both are logarithms of ratios of probabilities. The input denoted $\Lambda^{in}$, is the noisy information obtained from the channel. The second input denoted $\lambda^{in}$, is the extrinsic information obtained from the outer SPC code. Both inputs are the ratio of probabilities for symbol values. We have the following:

$$\Lambda_k^{in} = \log\frac{Pr(w_k=i;\cdot)}{Pr(w_k \neq i;\cdot)}, \quad (4)$$

$$\lambda_k^{in} = \log\frac{Pr(v_k=1;\cdot)}{Pr(v_k \neq 0;\cdot)}, \quad (5)$$

where $w_k$ denotes the noise free channel output, and $v_k$ is the precoder input.

For the block parity-check encoder, the APP decoder is based on the two-state trellis representation of the constituent parity-check encoder. Due to the independence between the parity-check code words, the decoder can use a window equal to the code word length. Importantly, the short window length opens up possibilities for parallel implementations to improve the speed of the detector, as will be appreciated by artisans.

In a particular embodiment of the block parity-check encoder, for example, the APP decoder may be based on the one-sweep algorithm proposed by Johansson and Zigangirov (J-Z algorithm), T. Johansson and K. Zigangirov, "A Simple One-Sweep Algorithm for Optimal APP Symbol Decoding of Linear Block Codes", *IEEE Trans. Inform. Theory*, Vol. 44, pp. 3124-3128, November 1998, which generalizes the parity check decoder that Gallager used for his low-density parity-check codes. R. G. Gallager, "Low-Density Parity-Check Codes," *IRE Trans. Inform. Theory*, Vol. 8, pp. 21-28, January 1962. We base our detector on the J-Z algorithm, but we note that a practical implementation might include further simplifications. WVe represent the J-Z algorithm for SPC codes, and then modify it to operate in the log-domain.

Input: $P(r_i|v_i)$, $1 \leq i \leq n$, where $r_i$ is the received sample for symbol i and $v_i$ denotes code symbol at time i.
1. Initialize $\mu(0,0)=1$, $\mu(1,0)=0$.
2. Recursively update for i=1, ... n $$\mu(0,i)=\mu(0,i-1)P(r_i|v_i=0)+\mu(1,i-1)P(r_i|v_i=1)$$

$$\mu(1,i)=\mu(1,i-1)P(r_i|v_i=0)+\mu(0,i-1)P(r_i|v_i=1)$$

$$P(v_i=0|r, c \in C) = \frac{\frac{P(r_i|v_i=0)}{P(r_i|v_i=1)} - \frac{\mu(1,n)}{\mu(0,n)}}{\frac{P(r_i|v_i=0)}{P(r_i|v_i=1)} - \frac{P(r_i|v_i=1)}{P(r_i|v_i=0)}} \quad (6)$$

if $P(r_i|v_i=0) \neq P(r_i|v_i=1)$.

Output: $P(v_i=0|r, c, \in C)$

If $P(r_1|v_i=0)=P(r_1|v_i=1)$, for any i then the algorithm can be further simplified. This is addressed in T. Johanansson and K. Zigangirov, "A Simple One-Sweep Algorithm for Optimal APP Symbol Decoding of Linear Block Codes", *IEEE Trans. Inform. Theory*, Vol. 44, November 1998, pp. 3124-28. We note that, for SPC codes, $\mu(0,n)=P(r|PC$ satisfied) and $\mu(1,n)=P(r|PC$ not satisfied). After some manipulations of the equations we find that $$\frac{\mu(1,n)}{\mu(0,n)} = \frac{P(PC \text{ not satisfied}|r)}{P(PC \text{ satisfied})|r)} \quad (7)$$

We define a function $\max^*(x,y)=\log(e^x+e^y)=\max(x,y)+f(x,y)$, where the function $f(x,y)=\log(1+e^{-|x-y|})$ is implemented as a look-up table. We summarize the J-Z algorithm in the log domain for SPC codes with odd parity as follows.
Input $$\gamma_i = \log\frac{P(v_i=1;\cdot)}{P(v_i=0;\cdot)}, 1 \leq i \leq n$$

1. Initialize $\alpha = \gamma_1$
2. For i=2, ... ,n-1 update $$\alpha = \max^*(\alpha, \gamma_i) - \max^*(0, \alpha+\gamma_1) \quad (8)$$

3. $\lambda_n = -\alpha$ $$\alpha = \max^*(\alpha, -\gamma_n) - \max^*(0, \alpha-\gamma_2)$$

4. For i=1, ... , n-1 set $$\lambda_i = \alpha + \log(1-e^{\gamma_i-\alpha}) - \log(1-e^{\gamma_i-\alpha})$$

Output: $\lambda_i$ as a priori information to the channel APP, and $$\mathbf{v}_i = \begin{cases} 1 & \text{if } \lambda_i + \gamma_i > 0 \\ 0 & \text{if } \lambda_i + \gamma_i \leq 0 \end{cases} \quad (9)$$

for i=1, ... , n-1, as hard decisions for the best current information word estimate. If $\gamma_i=0$ for some i and $\gamma_j \neq 0$ for all $j \neq i$ then we swap the values of $\gamma_i$ and $\gamma_n$ and run the algorithm up to step 3, and we set $\gamma_i=0$ for $1 \leq n-1$ and then swap the values of $\gamma_i$ and $\gamma_n$ to get the outputs in the right order. If $\gamma_i=0$ for more than one i, then we set all $\gamma_i=0$.

E. Performance Analysis

We have analyzed the performance of the FIG. 1 system by computing a maximum likelihood union bound for the probability of word error. Although the decoder does not implement maximum likelihood sequence estimation (MLSE), the performance of the iterative decoding structure has been shown to be close to that of MLSE. The maximum-likelihood (ML) union bound on word error rate (WER) for a block-coded, additive white Gaussian noise (AWGN) channel can be expressed as $$P_w \leq \sum_{d_E=d_{min}}^{\infty} \overline{T}(d_E)Q\left(\frac{d_E}{2\sigma}\right), \quad (10)$$

where $d_E$ denotes Euclidean distance between two channel output words, $\sigma^2$ denotes the noise variance on the channel and $\overline{T}(d_E)$ denotes the average Euclidean weight enumerator, which is the average number of code words whose channel outputs have Euclidean distance $d_E$ from the output of a given code word. The corresponding bit error rate (BER) bound is $$P_b \leq \sum_{d_E=d_{min}}^{\infty} \frac{\overline{T}(d_E)\overline{w}(d_E)}{K}Q\left(\frac{d_E}{2\sigma}\right), \quad (11)$$

where K denotes the number of information bits in a code word and $\overline{w}(d_E)$ denotes the average information Hamming distance between code words whose channel outputs have Euclidean distance $d_E$.

For an exact analysis, the full compound error-event characterization for a code interleaved and concatenated with the partial response channel must be determined. The complexity of this computation is often prohibitively high. To overcome this difficulty, we use a technique introduced in M. Oberg and P. H. Siegel, "Performance Analysis of Turbo-Equalized Dicode Partial-Response Channel", in *Proc. 35th Annual Allterton Conf. on Commun., Control, and Comp.*, (Monticello, Ill.) September 1998, pp.230-239, for computing an approximation to the average weight enumerator for a high-rate, coded partial response channel. For completeness, we briefly describe the application of this approximation in this setting.

Figure 3:
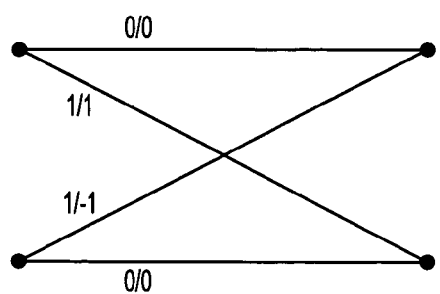
FIG. 3 illustrates a trellis section for a precoded dicode channel usable in FIG. 1.

FIG. 3 shows a trellis section for the dicode channel with precoder $g(D)=1/(1 \oplus D)$. The branch labels are of the form $c_i/x_i$, where $c_i$ is the input to the precoder at time i, and $x_i$ is the corresponding channel output. Referring to FIG. 3, it can be seen that an error word f may be decomposed into a sequence of $m=\lceil d_H(f)/2 \rceil$ simple error sub-events $f_i$, i=1, ... , m. For $1 \leq i \leq m-1$. each sub-event is closed, sub-event $f_m$ may be either closed or open. The length of the sub-event $f_i$ is denoted $l_i$, and the Hamming weight of a sub-event satisfies $$d_H(f_i) = \begin{cases} 2 & i=1, \ldots, m-1 \\ 2 & i=m \text{ and } d_H(f) \text{ even} \\ 1 & i=m, \text{ and } d_H(f) \text{ odd} \end{cases} \quad (12)$$

Let $j_i^0$ denote the bit position in the word where error sub-event $f_i$ begins. For a closed sub-event, let $j_i^1$ denote the bit position where it terminates. Then $l_i = j_i^1 - j_i^0 + 1$ for all closed sub-events. If $f_m$ is open, we define $j_m^1 = N+1$, and $l_m = j_m^1 - j_m^0$. Finally, we define $$L = \sum_{i=1}^{m} l_i.$$

The error word f has total squared Euclidean distance $$d_E^2(f) = \sum_{i=1}^{m} d_E^2(f_i) = d_H(f) + 4 \sum_{i=1}^{m} \sum_{k=j_i^0+1}^{j_i^1-1} C_k. \qquad (13)$$

The approximation is based upon the assumption that the code bit values in the error events may be treated as samples of independent, equiprobable binary random variables. Under this "i.i.d. assumption," the contribution of an error wordf to the average weight enumerator is given by the distribution $$Pr(d_E^2(f) = z \mid d_H(f) = d, L) = \binom{L-d}{(z-d)/4} 0.5^{L-d}. \qquad (14)$$

The i.i.d. assumption is justified by the action of the uniform interleaver for error words corresponding to short error event duration. On the other hand, when the duration of error events is long, the contribution to the dominant terms of the Euclidean error weight enumerator will be negligible, due to the low probability of such an error word generating small Euclidean distance. For a general linear block code, the accuracy of the i.i.d. assumption can be measured by reference to the weight enumerator of the dual code. In this instance, we are interested in the dual code of the N-fold concatenation of (n, 1) repetition codes.

For example, consider the rate 8/9 system consisting of N=128 concatenated parity-check codes with an interleaver of length 1152. The minimum distance of the dual code is 9, with multiplicity 128. Therefore, any 8 bits at the interleaver output are linearly independent, and the probability of choosing 9 linearly dependent bits is $128/(_9^{1152})$. These remarks apply also to the concatenation of odd parity-check codes; moreover, in any set of 9 dependent code bits, at least one of the bits must be a 1. In fact, there will be at least one symbol 1 in any set of linearly dependent code symbols at the interleaver output.

In M. Oberg, P. H. Siegel, "Performance Analysis of Turbo-Equalized Dicode Partial-Response Channel," in *Proc. 35th Annual Allerton Conf. on Commun., Control, and Comp.*, (Monticello, Ill.), September 1998, pp. 230-239, the distribution of the total length L of error words f generated by the action of a uniform interleaver upon an error word e of Hamming weight d was shown to be $$Pr(L \mid d) = \frac{\binom{N-L+\lfloor d/2 \rfloor}{\lfloor d/2 \rfloor}\binom{L-1-\lceil (d-1)/2 \rceil}{\lfloor (d-1)/2 \rfloor}}{\binom{N}{d}} \qquad (15)$$

The approximation of the Euclidean weight enumerator depends only upon the input-output Hamming weight enumerator of the outer code $$A(d) = \sum_{i=0}^{K} A(d, i),$$

where A(d, i) denotes the number of error words of Hamming output weight d and input weight i. It can be computed by substituting (14) and (15) into $$\overline{T}(d_E) = \sum_{k=1}^{N} A(k) \sum_{L=k}^{N-k} Pr(d_E \mid k, L) Pr(L \mid k). \qquad (16)$$

Similarly, the approximate average input error weight enumerator may be obtained from $$\overline{w}(d_E) = \frac{1}{\overline{T}(d_E)} \sum_{k=1}^{N} A(k) \overline{W}(k) \sum_{L=k}^{N-k} Pr(d_E \mid k, L) Pr(L \mid k), \qquad (17)$$

where $\overline{W}(d)$ is the average input weight for output weight d.

For the concatenation of Ar (n,n−1) even parity-check codes, the Hamming weight enumerating function IOWEF (D,I) is the product of N weight enumerating functions for a single (n,n−1) even parity-check code $$IOWEF(D, I) = \sum_{i \geq 0, d \geq 0} A(d, i) D^d I^i \qquad (18)$$

$$= \left[ \sum_{j=0}^{n-1} \binom{n-1}{j} D^{2\lceil j/2 \rceil} I^j \right]^N.$$

Since the odd parity-check code is a coset of the even parity-check code, the weight enumerating function for the even parity-check code can be used to enumerate the Hamming distance spectrum for the odd parity-check code. Finally, we remark that the approximated Euclidean distance spectrum does not reflect the use of odd parity in the code words.

Figure 4:
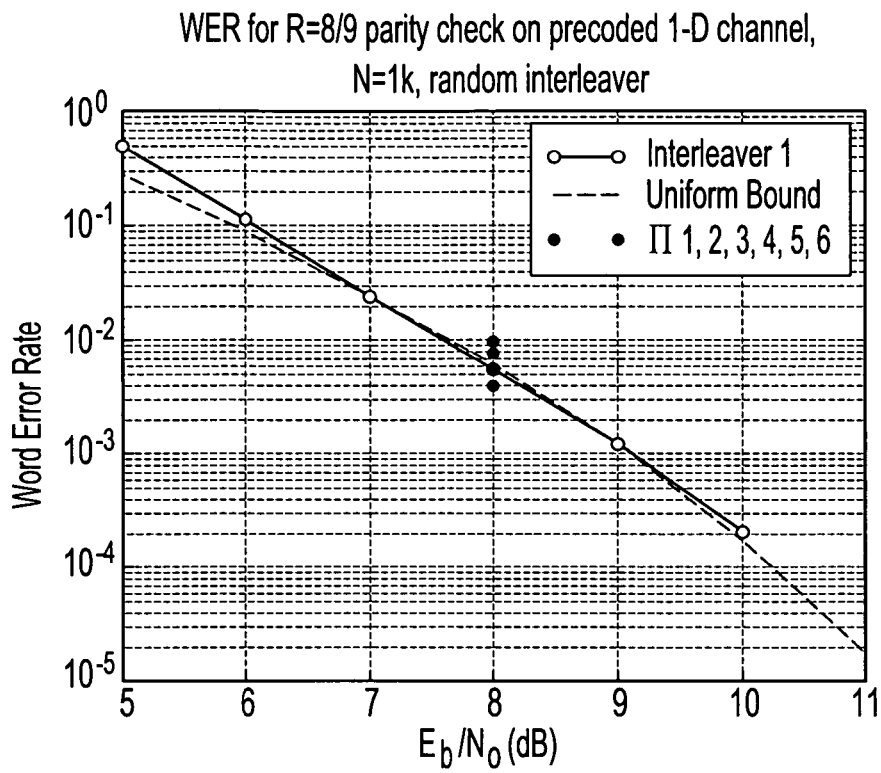
FIG. 4 is a plot estimating the word error rate upper bound for rate 8/9 system of the invention with a length of 1K for the channel of FIG. 3 and computer simulation of the same system.

We computed an estimate of the word-error-rate (WER) upper bound for the rate 8/9 system on the precoded dicode (h(D)=1−D) channel with N=128 and a uniform interleaver. The estimate is shown in FIG. 4 together with simulation results. We have also plotted simulation results for different interleavers at $E_b/N_0$=8.0 dB. Note how the corresponding points are located on both sides of the estimated bound, consistent with the fact that the analysis assumes a uniform interleaver. The agreement is quite good in all cases.

Figure 5:
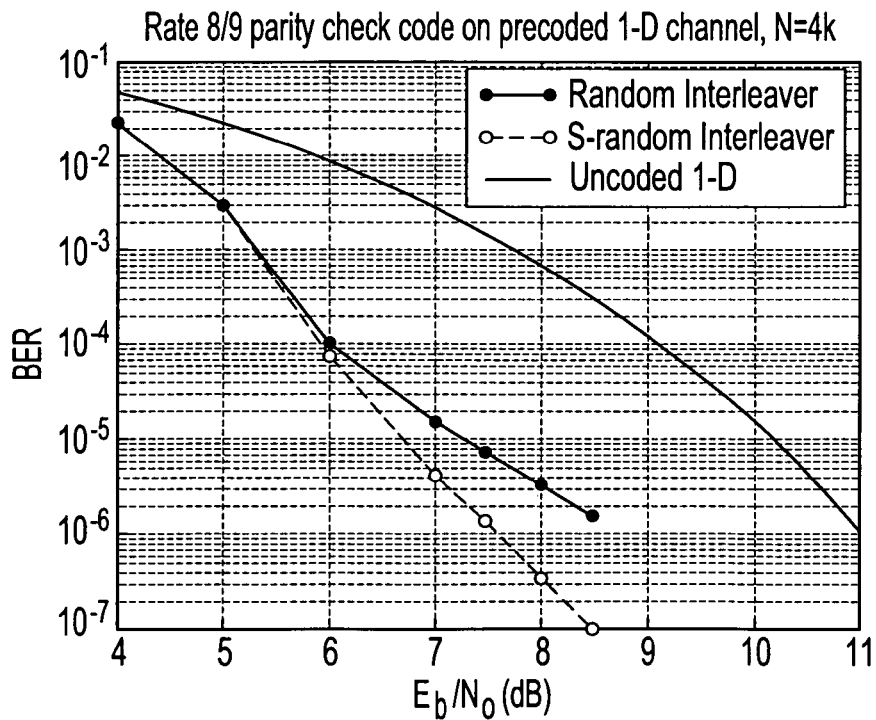
FIG. 5 is a plot of simulated bit-error-rate performance for a rate 8/9 system of the invention with N=512 and an S-random interleaver length of 4K.

In FIG. 5, the simulated bit-error-rate (BER) performance for the rate 8/9 system with N=512 and a randomly-generated interleaver is compared to that of a system using an S-random interleaver, with S=30. Clearly, the S-random interleaver improves the performance of the system. The better performance with the S-random interleaver can be explained by analyzing the effects of equations (14) and (15) and (16). This analysis depends upon the particular S-random interleaver, but a heuristic understanding follows from the following observations. First, note that the value of equation (14) increases as L increases. For a parity-check code with n<S, the use of an S-random interleaver implies $$Pr(L|2)=0 \text{ for } L \leq S, \quad (19)$$

because the S-random interleaver cannot map two bits from the same parity-check code word to positions closer than S. Hence, the non-zero contribution to equation (16) for k=2 must correspond to values of L greater than S. For S>$\log_2$(N), the contribution to equation (16) corresponding to $d^2(E)=2$ will be smaller for the S-random interleaver than for the uniform interleaver.

Figure 6:
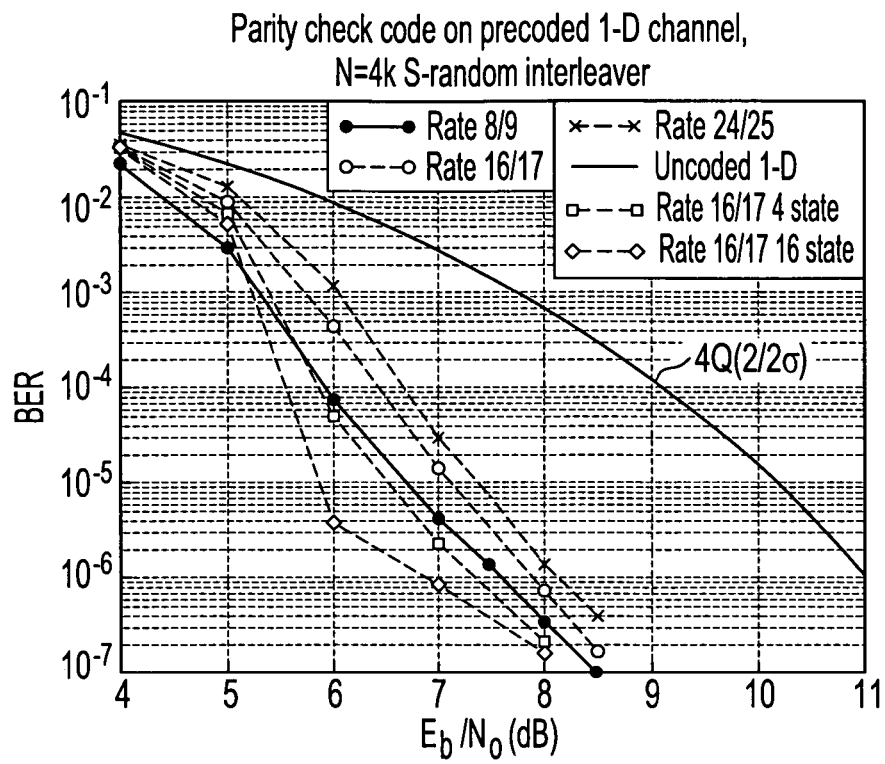
FIG. 6 is a set of simulation results for rate 8/9, 16/17 and 24/25 parity check codes of the invention on a dicode channel usable in FIG. 1 using S-random interleavers.

FIG. 6 shows simulation results for rate 8/9, 16/17, and 24/25 parity check codes on the dicode channel using S-random interleavers. Included in the graph, for comparison purposes. are performance curves corresponding to the 4-state and 16-state recursive systematic convolutional (RSC) outer codes, using an S-random interleaver. The outer codes were rate 1/2, with encoder polynomials $(1, 5/7)_{octal}$ and $(1, 33/31)_{octal}$, punctured to rate 16/17. These are the outer codes used in T. Souvignier, A. Friedman, M. Oberg, P. H. Siegel, R. E. Swanson, J. K. Wolf, "Turbo Codes for PR4: Parallel Versus Serial Concatenation", in *Proc. IEEE Int. Conf. Commun.*, (Vancouver, BC, Canada) IEEE, June 1999, and M. Oberg, P. H. Siegel, "Performance Analysis of Turbo-Equalized Dicode Partial-Response Channel," in *Proc. 35th Annual Allerton Conf. on Commun., Control, and Comp.*, (Monticello, Ill.), September 1998, pp. 230-239 on D. Divsalar, F. Pollara, "Turbo Codes for PCS Applications," in *Proc. IEEE Int. Conf. Commu.*, (Seattle, Wash.), June 1995, pp. 54-59, although the results reported therein were for a random interleaver. The system with the 16-state RSC outer code outperforms the system with parity check codes by more than 1 dB at BER $10^{-5}$, but at BER $10^{-7}$ the difference is only about 0.5 dB. The performance of the system with the 4-state RSC outer code is also better than that achieved with the parity check code, but only by about 0.5 dB, even at BER $10^{-5}$.

Figure 7:
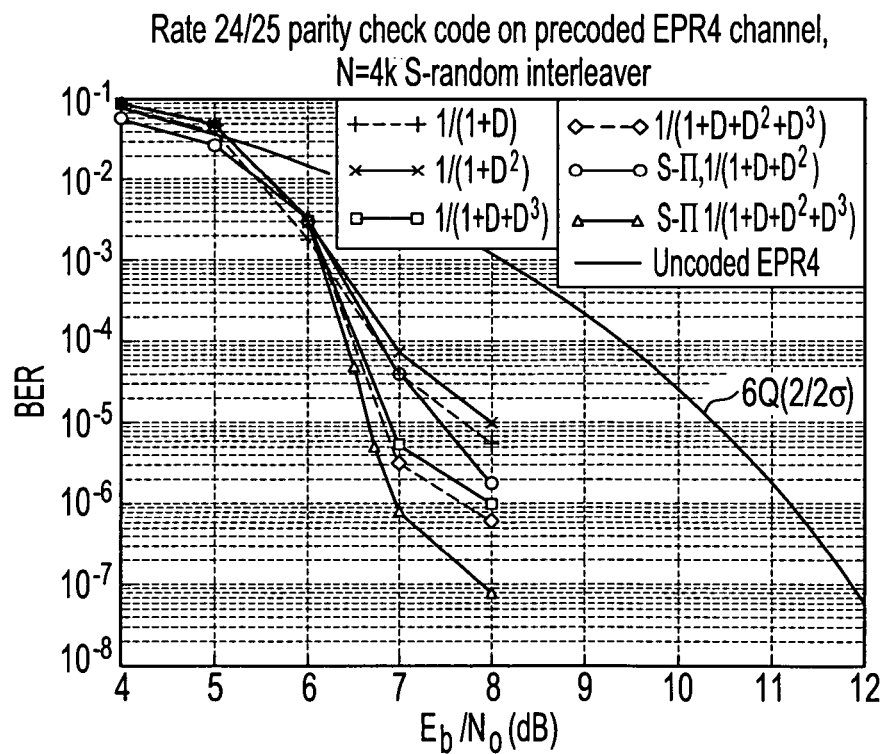
FIG. 7 shoves simulation results for four separate precoders on an EPR4 channel usable in the FIG. 1 system.

The results for higher order channels are similar. For example, FIG. 7 shows simulation results for a rate 24/25 parity-check code on an EPR4 channel in the FIG. 1 system, using a pseudo-random interleaver. Results were obtained for four different precoders: $1/(1\oplus D)$, $1/(1\ominus D^2)$, $1/(1\oplus D \oplus D^3)$ and $1/(1\oplus D \oplus D^2\oplus D^3)$. The poorer performance of the first two precoders can be attributed, in part, to the fact that weight-1 sequences can be generated at their output by certain weight-2 input sequences, namely $(1\oplus D)$ and $(1\oplus D^2)$, respectively. The figure also shows the performance for two of these precoders when an S-random interleaver with S=30 was used. Although not shown, when the method of the invention is applied to the $E^2PR4$ channel, the coding gains relative to the uncoded channel are similar.

Analytical and simulation results thus show that this is an attractive approach, for example, to increase the capacity in magnetic storage devices. The performance in terms of bit error rate (BER) for a rate 16/17 system on the dicode channel is $10^{-5}$ at $E_b/N_0=7.1$ dB. This is only about 1.7 dB worse than a corresponding system with a 16-state outer convolutional code, and about 3 dB better than an uncoded system. At BER of $10^{-7}$ the performance difference is only about 0.5 dB. With a 4-state convolutional outer code, the difference is about 0.5 dB at most bit error rates.

F. Incorporation of Runlength Constraints

Figure 8:
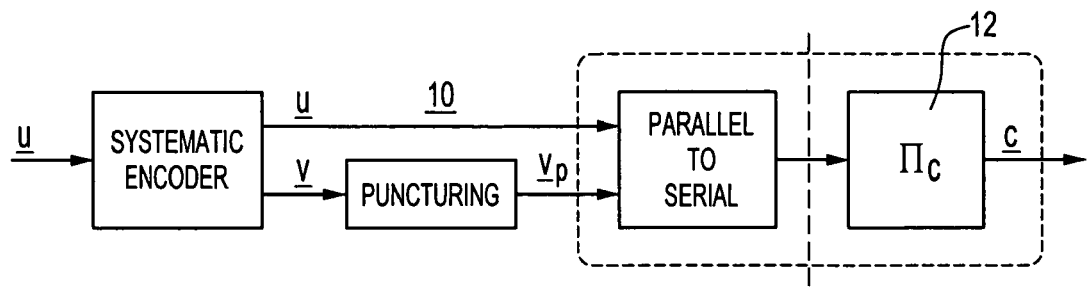
FIG. 8 is a block diagram of a general serial architecture for the encoder of FIG. 1 and systems using prior art outer codes.

Magnetic storage devices often implement PRML and incorporate runlength constraints. The method of the invention may be modified to incorporate such constraints. Referring now to FIG. 8, a general serial-concatenation architecture applicable to the encoder 10 of FIG. 1 is shown in FIG. 8. As indicated, we will assume that the outer encoder is a systematic encoder. In the applications of interest, this encoder will be punctured to a high rate. For example, the outer error code may be a punctured turbo code, a punctured systematic convolutional code, or a systematic parity check code of the invention described above with reference to FIGS. 1-7.

In this configuration, a pseudo-random interleaver would likely destroy any runlength constraints satisfied by the input to the outer encoder. Moreover, if runlength constraints are imposed by use of an inner code comprising a runlength-constrained encoder in cascade with the precoded partial-response channel, the benefits of turbo equalization would be sacrificed.

As an alternative approach to incorporating runlength constraints while maintaining the benefits of turbo-equalization, we will now consider a modification of the general serial architecture. As mentioned above, other error codes may be used in place of the parity symbols in this method. First, we constrain the interleaver so that the systematic symbols are mapped to systematic symbols and parity (or other error codes) symbols to parity (or other error codes) symbols. This permits the interleaver $\Pi_c$ to be moved from the output of the multiplexer (parallel-to-serial converter) to its input, as shown in FIG. 9.

Figure 10:
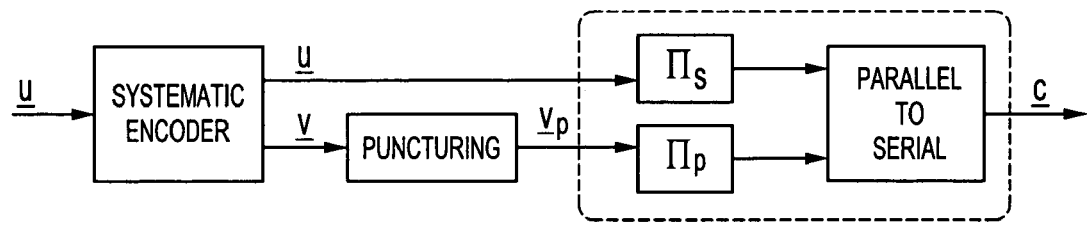
Figure 11:
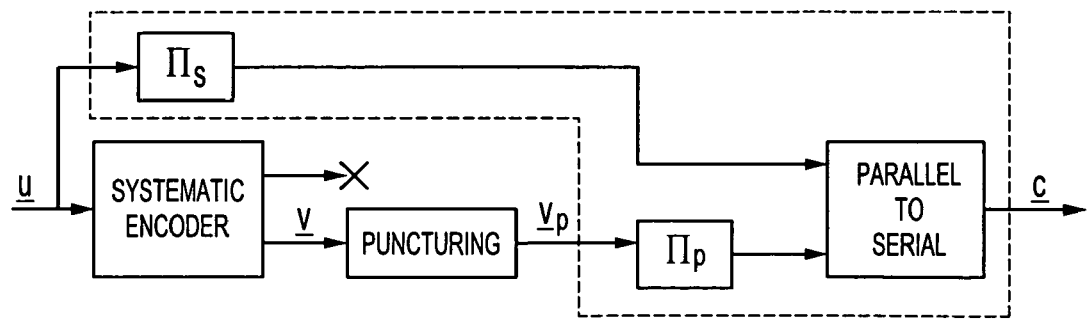
Figure 12:
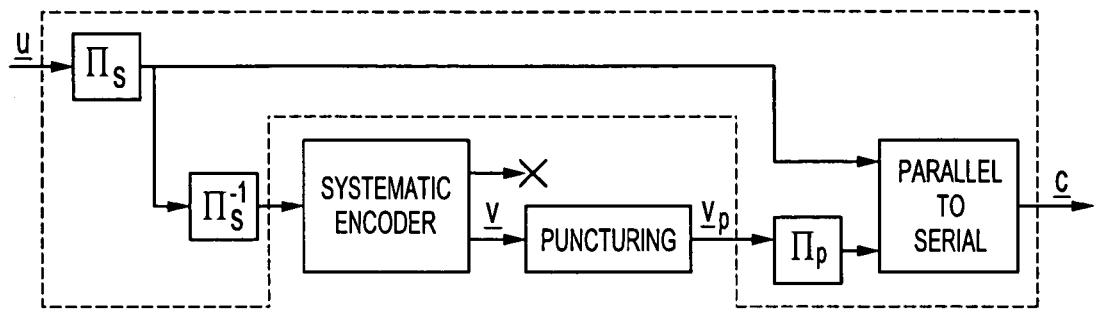
Figure 13:
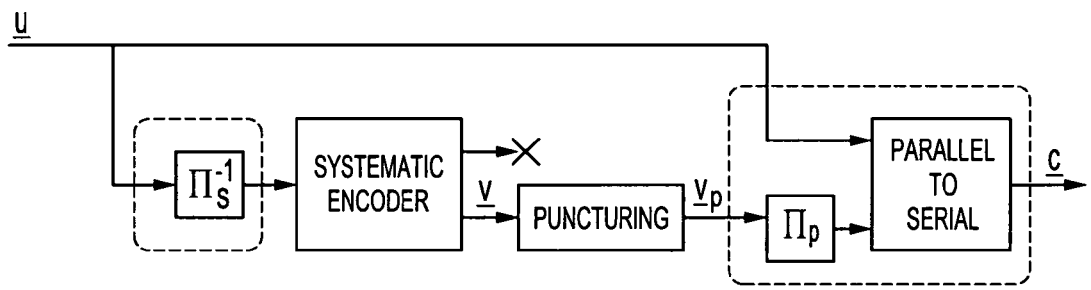

The interleaving operation can now be described in terms of two distinct permuters, $\Pi_s$ and $\Pi_p$ applied to the stream of systematic bits and the stream of parity bits (possibly punctured), respectively. This structure is shown in FIG. 10, and in an alternative form in FIG. 11, in which the systematic bits are routed directly to the multiplexer, rather than via the systematic encoder block. We can now obtain an equivalent system by placing the interleaver $\Pi_s$ prior to the outer encoder, and then inserting a deinterleaver at the input to the encoder, as shown in FIG. 12. If the input to the system is assumed to be a sequence of independent, equiprobable, random binary digits, the removal of the interleaver $\Pi_s$ will not change the performance of the overall system. The system with this interleaver removed is shown in FIG. 13. This modified architecture may be used to incorporate runlength constraints into the channel input stream without sacrificing the performance benefits of turbo-equalization.

Figure 14:
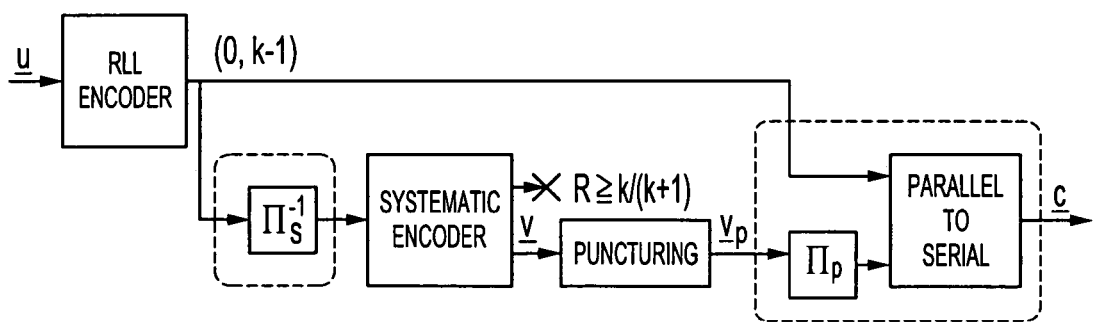
FIG. 14 is a block diagram illustrating a modified preferred embodiment of the invention.
Figure 15:
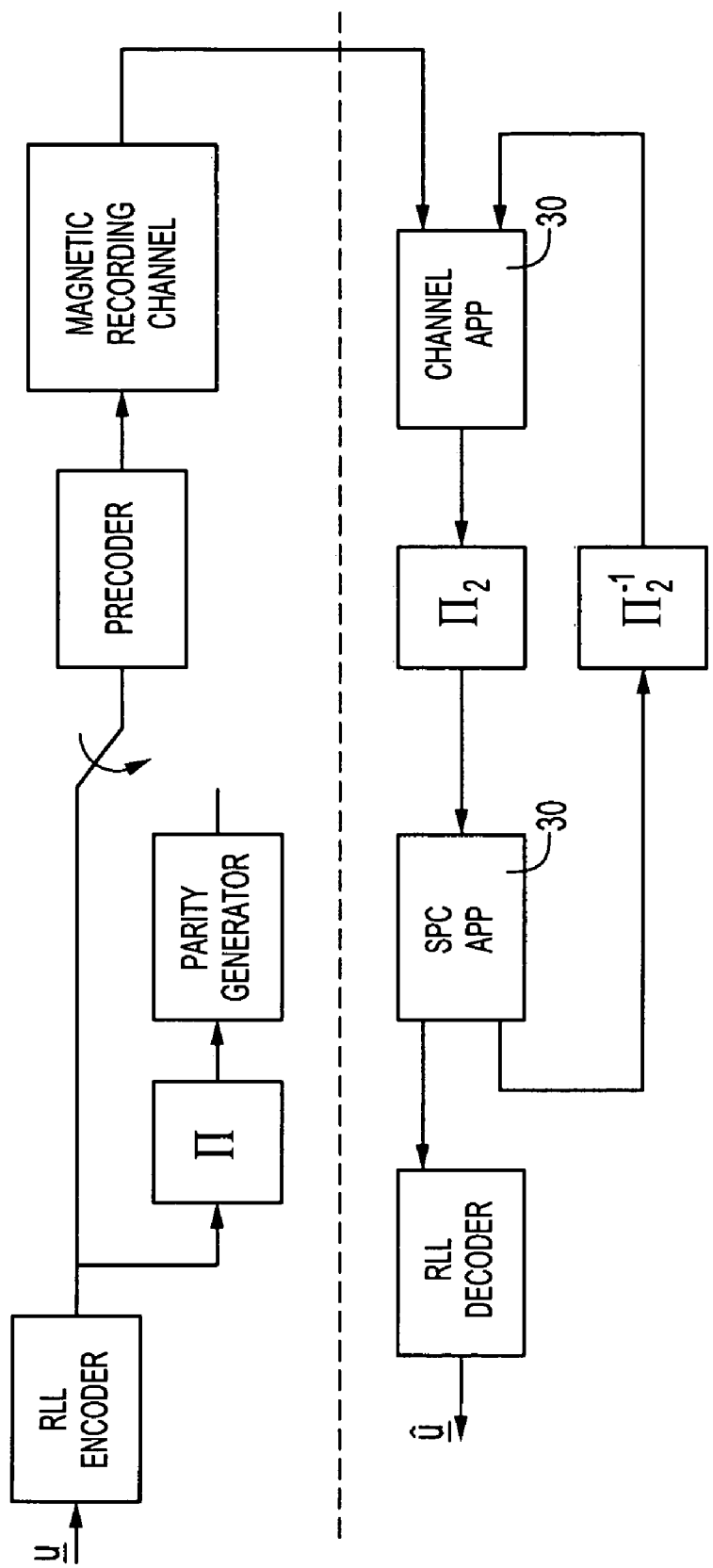
FIG. 15 is a block diagram of a preferred runlength constrained parity check coded system of the invention.

The modified serial concatenation architecture can be applied to systems requiring a runlength-limiting (RLL) constraint at the channel input. For example, suppose that a RLL (0, k) binary input constraint is desired at the input to the precoded channel; that is, runs of zeros of length greater than k are forbidden. This constraint can be achieved by using a RLL (0, k–j) encoder at the input to the system, for some $1 \leq j \leq k-1$. If the rate R of the systematic outer encoder satisfies $R \geq (k-j+1)(k+1)$, and the multiplexer inserts no more than j parity bits into any block of k–j+1 consecutive systematic bits, then the channel input stream will satisfy a RLL (0, k) constraint. FIG. 14 depicts such a modified system of the invention corresponding to j=1.

Figure 9:
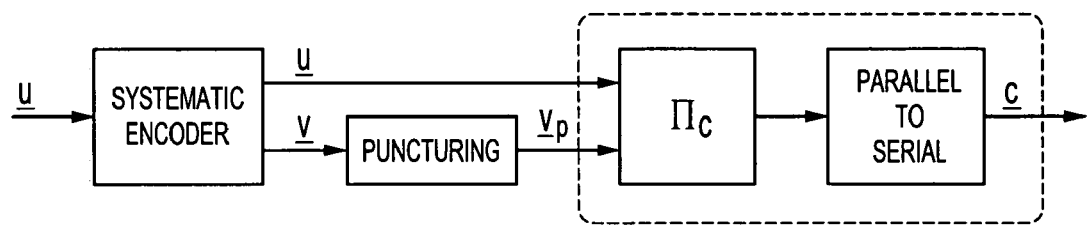
FIGS. 9-13 are block diagrams illustrating the basis for a modified architecture of the invention.

The decomposition in FIGS. 9 and 10 of the original interleaver into separate interleavers for the systematic bits and parity bits, as well as the removal of interleaver U, in FIG. 13, do not have a significant effect upon the system performance when the input stream is generated by a high-rate RLL encoder.

As a more concrete example, suppose that a rate 16/17 RLL (0,6) encoder provides the input to a serial-concatenated system as in FIG. 14, based upon a rate 24/25, systematic parity code. The parity interleaver $\Pi_p$ is assumed to be the identity permutation. If the parity encoder inserts a parity bit after every 24 systematic bits, then the maximum runlength of zeros at the output of the system is no more than 7; in other words, the input to the channel is effectively a rate R=384/425, RLL (0,7)-constrained sequence.

Figure 16:
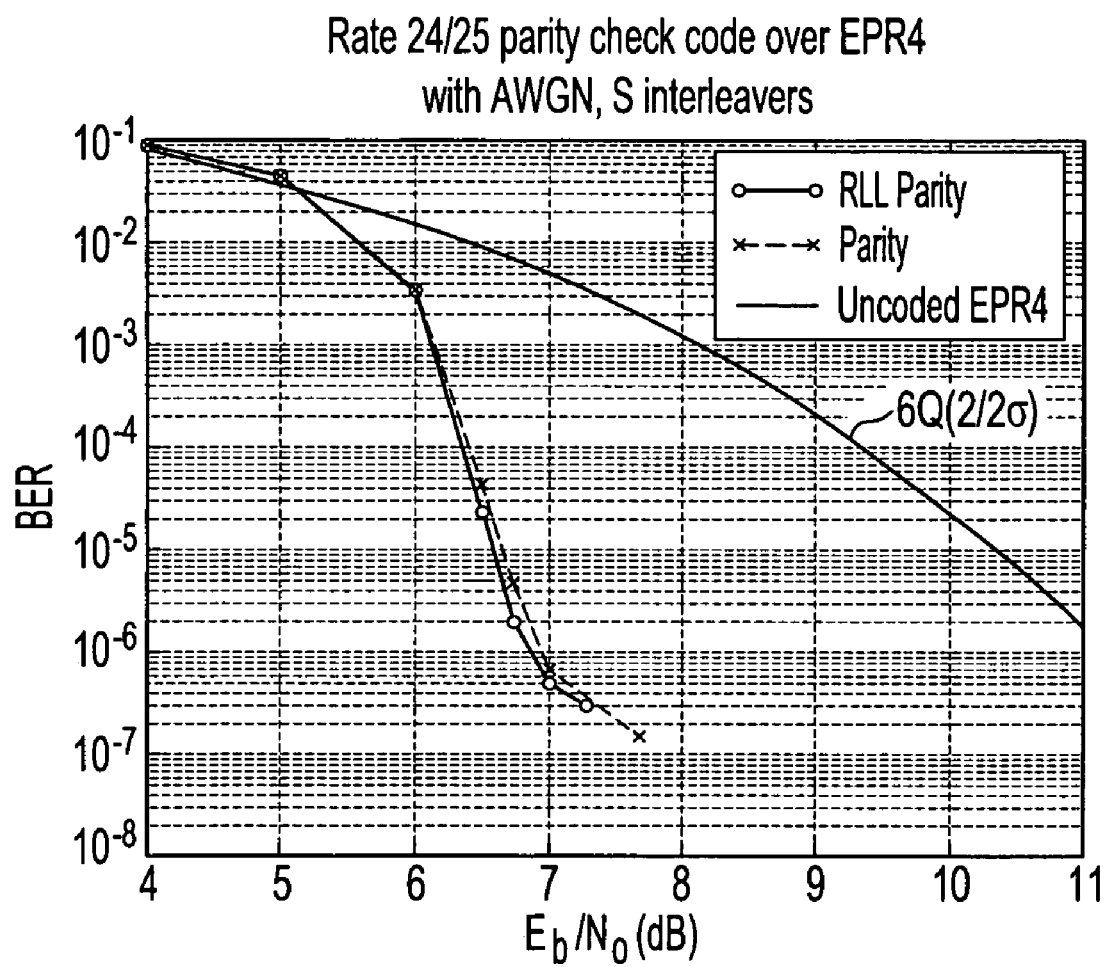
FIG. 16 is a set of simulation results for the FIG. 15 system for a particular RLL encoder and parity check encoder.

Simulation results for a system based upon the example above are shown in FIG. 16. The RLL encoder is a rate 16/17, PRML (0, G/I)=(0,6/6) encoder of Patel, IBM Technical Disclosure Bulletin, Vol. 31, No. 8, January 1989. The outer code is a rate 24/25 systematic encoder, with input-frame/interleaver length N=4080 binary symbols. The interleaver $\Pi_s^{-1}$ is an S-random permuter. As mentioned above, the parity interleaver $\Pi_p$ is assumed to be the identity interleaver. The channel is the extended partial-response class-4 (EPR4) channel with precoder p(D) given by $p(D)=1/(1 \oplus D \oplus D^2 \oplus D^3)$. The noise is assumed to be additive, Gaussian, and uncorrelated.

FIG. 16 compares the rate-normalized bit-error-rate (BER) of this RLL-encoded, parity code to that of the rate 24/25 parity-coded EPR4 system, over a range of values of $E_b/N_o$. The performance of an uncoded EPR4 channel with channel-matched maximum-likelihood sequence (Viterbi) detection is also shown for reference purposes. The two turbo-equalized systems display nearly identical performance, achieving a gain in excess of 4 dB over the uncoded EPR4 channel.

The modified serial-concatenation architecture of FIG. 14 can be used to impose runlength constraints on the interleaves of the precoded channel input stream. There are also alternative strategies for placement of the parity bits and imposition of runlength constraints. For example, the parity bits can be combined into a contiguous block which is runlength encoded and then inserted following the frame of systematic bits.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A channel coding method for encoding systematic data for transmission in a communication channel, the method comprising steps of:
   generating a parity check bit for each data word of the systematic data;
   appending a generated parity check bit to each data word to form a code word;
   permuting a group of code words, a permutation of the group of code words being encoded input for transmission in the communication channel.

2. The channel coding method according to claim 1, wherein said step of permuting comprises pseudo-random interleaving.

3. The channel coding method according to claim 2, wherein said pseudo random interleaving prohibits bits which are closer than a predetermined distance prior to interleaving from being closer to that predetermined distance after interleaving.

4. The channel coding method according to claim 1, wherein said steps of generating and appending are conducted for multiple data words in parallel by a group of parallel parity check encoders.

5. A system for encoding systematic data for transmission in a communication channel comprising:
   at least one encoder, each encoder generating a parity check bit for each data word of the systematic data and appending the generated parity check bit to each data word to form a code word;
   an interleaver permuting a group of code words, a permutation of the group of code words being encoded input for transmission in the communication channel.

6. The system according to claim 5, wherein the interleaver permutes the group of code words by pseudo-random interleaving.

7. The system of claim 6, wherein the interleaver prohibits bits that are closer than a predetermined distance prior to said pseudo-random interleaving from being closer to that predetermined distance after said pseudo-random interleaving.

8. The system according to claim 5, wherein said at least one parity encoder comprises a group of parallel parity check encoders that generate and append multiple data words in parallel.

9. A channel decoding method for decoding encoded output of an encoder receiving an input, the encoded output transmitted through a precoder and a communication channel, the method comprising steps of:
   receiving the encoded output, wherein said encoded output is formed by generating a parity check bit for each data word of systematic data, said parity check bit being appended to each data word to form a code word such that a group of code words is formed and permuted to form the encoded output;
   computing a probability of transmission accuracy of said encoded output according to said input or encoded output of said encoder to verify transmission of said encoded output;
   determining if the probability of transmission accuracy exceeds a minimum threshold, and if so, transmitting the decoded output as systematic data.

10. The decoding method according to claim 9, wherein said group of code words are permuted by pseudo-random interleaving.

11. The decoding method according to claim 10, wherein said pseudo-random interleaving prohibits bits which are closer than a predetermined distance prior to interleaving from being closer to that predetermined distance after interleaving.

12. The channel decoding method according to claim 9, further comprising the step of re-computing the probability of transmission accuracy of said encoded output according to said input or encoded output of said encoder to verify transmission of said encoded output.

13. The channel decoding method according to claim 12, wherein the step of re-computing is reiterated a number of times prior to transmitting the decoded output as systematic data.

14. A decoder comprising:
   a first soft-in soft-out decoder receiving an encoded input, wherein said encoded input is formed by generating a parity check bit for each data word of systematic data, said parity check bit being appended to each data word to form a code word such that a group of code words is formed and permuted to form the encoded input;
   a second soft-in soft-out decoder connected to the first decoder;
   a deinterleaver receiving an output of said first soft-in soft-out decoder and providing an output to an input of said second soft-in soft-out decoder; and an interleaver receiving an output of said second soft-in soft-out decoder and providing an output to an input of said first soft-in soft-out decoder.

15. The decoder according to claim 14, wherein the first and second soft-in soft-out decoders are a-posteriori probability detectors.

16. The decoder according to claim 14, wherein the encoded input is transmitted by an encoder through a precoded channel to said first soft-in soft-out decoder, said first soft-in soft-out decoder being matched to said precoded channel and said second soft-in soft-out decoder being matched to said encoder.

17. A decoder comprising:

a first soft-in soft-out decoder receiving an encoded input, wherein said encoded input is formed by generating an odd parity check bit for each data word of systematic data, said odd parity check bit being appended to each data word to form a code word such that a group of code words is formed and permuted to form the encoded input;

a second soft-in soft-out decoder connected to the first decoder;

a deinterleaver receiving an output of said first soft-in soft-out decoder and providing an output to an input of said second soft-in soft-out decoder; and an interleaver receiving an output of said second soft-in soft-out decoder and providing an output to an input of said first soft-in soft-out decoder.

18. The decoder according to claim 17, wherein the first and second soft-in soft-out decoders are a-posteriori probability detectors.

19. The decoder according to claim 17, wherein the encoded input is transmitted by an encoder through a precoded channel to said first soft-in soft-out decoder, said first soft-in soft-out decoder being matched to said precoded channel and said second soft-in soft-out decoder being matched to said encoder.

* * * * *

UNITED STATES PATENT AND TRADEMARK OFFICE
CERTIFICATE OF CORRECTION

PATENT NO. : 7,284,186 B2  Page 1 of 3
APPLICATION NO. : 10/862847
DATED : October 16, 2007
INVENTOR(S) : Paul H. Siegel et al.

It is certified that error appears in the above-identified patent and that said Letters Patent is hereby corrected as shown below:

Column 4, Line 7, please delete "shoves" and insert --shows-- therefor.

(Specification, page 6, line 14)

Column 4, Line 47, please insert --, i-- after the end parenthesis.

(Specification, page 7, line 17)

Column 5, Line 25, please delete "O . . . O" and insert --$\oplus$ . . . $\oplus$-- therefor.

(Specification, page 8, line 21)

Column 5, Line 29, please delete "-" and insert --=-- therefor.

(Specification, page 8, line 24)

Column 5, Line 54, please delete "*Commons*" and insert --*Commun*-- therefor.

(Specification, page 9, line 16)

Column 5, Line 65, after "of size", please delete "1" and insert --*l*-- therefor.

(Specification, page 9, line 23)

Column 6, Line 10, please delete "L$_i$" and insert --$\underline{L}_i$-- therefor.

(Specification, page 10, line 3)

Column 6, Line 11, please delete "L$_o$" and insert --$\underline{L}_o$-- therefor.

(Specification, page 10, line 3)

Column 6, Line 30, please delete "$\Lambda^{in}$" and insert --$\lambda^{in}$-- therefor.

(Specification, page 10, line 13)

Column 6, Line 65, please delete "WVe" and insert --We-- therefor.

(Specification, page 11, line 16)

UNITED STATES PATENT AND TRADEMARK OFFICE
CERTIFICATE OF CORRECTION

PATENT NO. : 7,284,186 B2
APPLICATION NO. : 10/862847
DATED : October 16, 2007
INVENTOR(S) : Paul H. Siegel et al.

It is certified that error appears in the above-identified patent and that said Letters Patent is hereby corrected as shown below:

Column 7, Line 1, please delete "$\leqq i \leqq$" and insert --$\leq i \leq$-- therefor. (Specification, page 11, line 18)3

Column 7, Line 19, after "If", please delete "$P(r_1|v_i = 0) = P(r_1|v_i = 1)$" and insert --$P(r_i|v_i = 0) = P(r_i|v_i = 1)$-- therefor. (Specification, page 12, line 4)

Column 7, Line 50, please delete "$\alpha\text{-}\gamma_2$" and insert --$\alpha\text{-}\gamma_n$-- therefor. (Specification, page 13, line 1)

Column 7, Line 65, please delete "$\gamma_i=0$" and insert --$\lambda_i=0$-- therefor. (Specification, page 13, line 8)

Column 7, Line 65, please delete "$\leqq$" and insert --$\leq$-- therefor. (Specification, page 13, line 8)

Column 7, Line 66, please delete "$\gamma_i$ and $\gamma_n$" and insert --$\lambda_i$ and $\lambda_n$-- therefor. (Specification, page 13, line 8)

Column 7, Line 67, please delete "$\gamma_i=0$" and insert --$\lambda_i=0$-- therefor. (Specification, page 13, line 8)

Column 8, Line 55, please delete "$\leqq i \leqq$" and insert --$\leq i \leq$-- therefor. (Specification, page 14, line 22)

Column 8, Line 57, please delete "$1_i$" and insert --$l_i$-- therefor. (Specification, page 15, line 1)

Column 9, Line 1, please delete "$1_i$" and insert --$l_i$-- therefor. (Specification, page 15, line 5)

UNITED STATES PATENT AND TRADEMARK OFFICE
CERTIFICATE OF CORRECTION

PATENT NO. : 7,284,186 B2
APPLICATION NO. : 10/862847
DATED : October 16, 2007
INVENTOR(S) : Paul H. Siegel et al.

It is certified that error appears in the above-identified patent and that said Letters Patent is hereby corrected as shown below:

Column 9, Line 22, please delete "word$f$" and insert --word$f$-- therefor. (Specification, page 15, line 12)

Column 9, Line 46, please delete "$128/(_9^{1152})$" and insert -- $\mathbf{128/(^{1152}_{9})}$ -- therefor. (Specification, page 16, line 12)

Column 10, Line 30, after "of", please delete "Ar" and insert --$N$-- therefor. (Specification, page 17, line 10)

Column 12, Line 52, please delete "$\leqq j \leqq$" and insert --$\leq j \leq$-- therefor. (Specification, page 21, line 17)

Column 12, Line 53, please delete "$\geqq$" and insert --$\geq$-- therefor. (Specification, page 21, line 18)

Column 12, Line 60, please delete "U" and insert --$\Pi_s$-- therefor. (Specification, page 21, line 23)

Signed and Sealed this

Third Day of June, 2008

JON W. DUDAS
*Director of the United States Patent and Trademark Office*